July 7, 1970 A. T. MONACO 3,519,889

ASSEMBLY WITH TRANSISTOR HEAT DISSIPATION

Filed Nov. 6, 1967

Inventor
ANTHONY T. MONACO

BY Mueller, Aichele & Rauner

ATTYS.

3,519,889
ASSEMBLY WITH TRANSISTOR HEAT DISSIPATION

Anthony T. Monaco, Skokie, Ill., assignor to Motorola, Inc., Franklin Park, Ill., a corporation of Illinois Filed Nov. 6, 1967, Ser. No. 680,921
Int. Cl. H01l *1/12*
U.S. Cl. 317—100 2 Claims

ABSTRACT OF THE DISCLOSURE

The assembly includes a panel upon which are mounted a transistor and other electrical components electrically interconnected. A clip mounts the transistor to a body composed of thermally conductive material to carry heat generated in the transistor to the body.

BACKGROUND OF THE INVENTION

In the past, it was believed that only power transistors had to be in contact with a heat sinking body such as a chassis in order to carry away excessive heat generated by the transistors. This was easily accomplished by passing studs formed on the package of such transistor through the heat sinking body and using nuts to provide a secure connection. Transistors in the medium power category are not mounted in such a package, first because the size is not usually necessary and, second, because the cost is unnecessarily increased. In certain circuits where it was desirable to dissipate heat developed by such a medium power transistor, a small device of substantial surface area was formed to correspond to the shape of the transistor package and was pressed or clipped on. The device was left floating or mechanically attached to the nonconductive transistor mounting board in either of which cases the entire heat dissipation was provided by the device itself. However, where the transistor is to be used near its peak power rating, such devices have insufficient surface area to dissipate the heat thereby developed.

SUMMARY OF THE INVENTION

It is, therefore, an object of this invention to provide heat dissipation for small, medium power transistors.

Another object is to enable mounting and heat sinking a transistor to a thermally conductive body of large surface area after the transistor is mounted in its printed circuit board.

In brief, the assembly includes a semiconductor device and other electrical components mounted on a support panel. Electrical interconnections of the components and the device causes the device to generate heat. One surface of the device is in intimate contact with a body composed of thermally conductive material which has a surface area substantially larger than the surface area of the device. A clip in intimate contact with the other of the surfaces of the device engages the body and draws the device tightly against the body and is composed of thermally conductive material for carrying heat generated in the device to the body.

DETAILED DESCRIPTION OF THE PREFERRED EMBODIMENTS

Figures 1, 2:
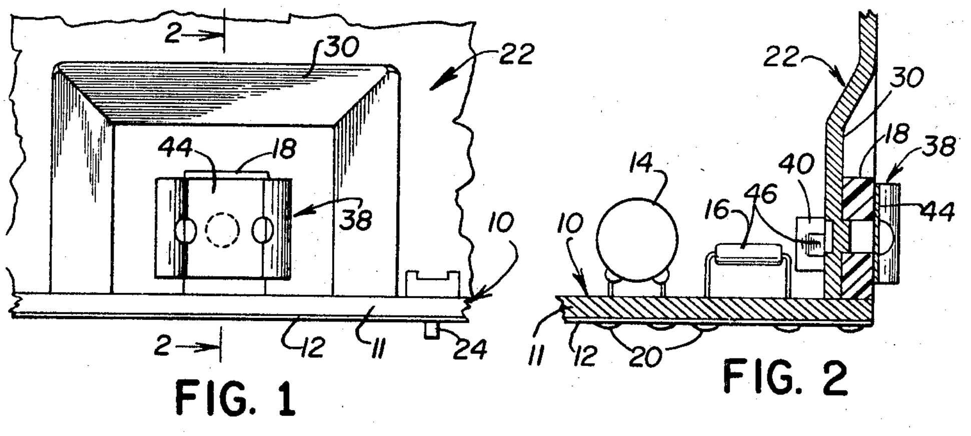
FIG. 1 is an elevation view of the assembly of the invention showing a printed circuit board, a chassis, and a transistor heat sunk to the chassis.
FIG. 2 is a sectional view along the line 2—2 of FIG. 1.
Figure 3:
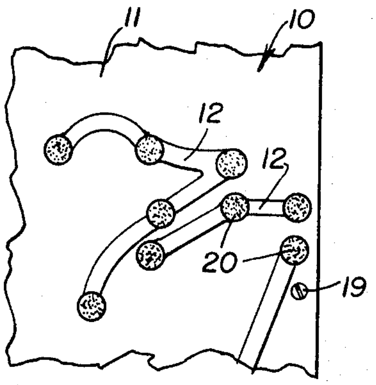
FIG. 3 is a bottom view of the printed circuit board of FIG. 1.

Referring now to FIGS. 1–3, the assembly includes a panel 10 in the form of a printed circuit board and comprising an insulation backing 11 and a multiplicity of conductive strips 12 in the form of a plated circuit. Electrical components such as a capacitor 14, a resistor 16 and a transistor 18 have their leads inserted through holes 19 in the board and soldered to the conductive strips 12 as indicated by the numerals 20. The transistor 18 is mounted adjacent the edge of the panel 10. The finished panel is horizontally mounted on a vertical frame or metal chassis 22. The panel 10 is moved upwardly until ear 24 (other ears are not shown) formed on the chassis 22 is inserted in a corresponding hole in the panel 10. Preferably these holes are in the conductive strips 12 which are to be at ground reference potential. The leads are then soldered in place so that the panel 10 is retained by the chassis 22.

Figure 4:
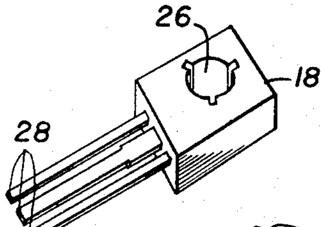
FIG. 4 is a perspective view of the transistor of FIG. 1.
Figure 5:
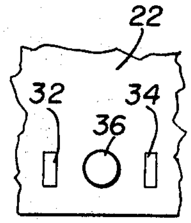
FIG. 5 is a plan view of a portion of the chassis of FIG. 1.
Figure 6:
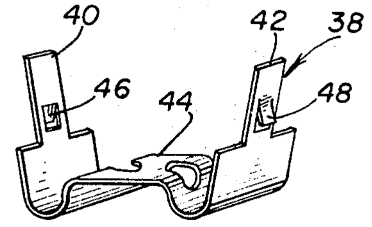
FIG. 6 is a perspective view of the mounting clip of FIG. 1.

As shown in FIG. 4, the transistor 18 is in the form of a block and has a hole 26 extending through it and three leads 28. A recess 30 is formed in chassis 22 with a depth approximately equal to the width of the transistor 18. When the panel 10 is mounted to the chassis 22, the transistor 18 fits within the recess 30. As shown in FIG. 5, a pair of slots 32 and 34 and a knub 36 are formed in the back of the recess 30. The clip 38 shown in FIG. 6 is formed by bending a single strip of metal to form a pair of legs 40 and 42 and a resilient central portion 44. Integrally formed on each of the legs is a wing 46 and 48, respectively.

After the panel 10 is mounted to the chassis 22, the transistor 18 extends within the recess 30. The legs 40 and 42 of the clip 38 are flexed and inserted through the slots 32 and 34 respectively so that portion 44 bears against one of the surfaces of the transistor 18 and causes the other surface of the transistor to be in intimate contact with the chassis 22. Upon release of the legs 40 and 42, they spring outwardly and the wings 46 and 48 engage the undersurface of the chassis 22 to provide a secure mechanical connection of the transistor to the chassis 22. In addition, the chassis 22 is able to carry away heat generated in the transistor 18 because of the intimate contact provided. The knub 36 fits within the hole 26 in the transistor 18 to provide protection against lateral movement of the transistor.

Because the transistor 18 is adjacent the panel edge, it will naturally overlie the chassis 22 after the panel 10 is attached. The required heat sinking provided by the large surface area of the chassis 22 is utilized by simply attaching the clip 38 after the panel 10 is mounted in place.

Figures 7, 8:
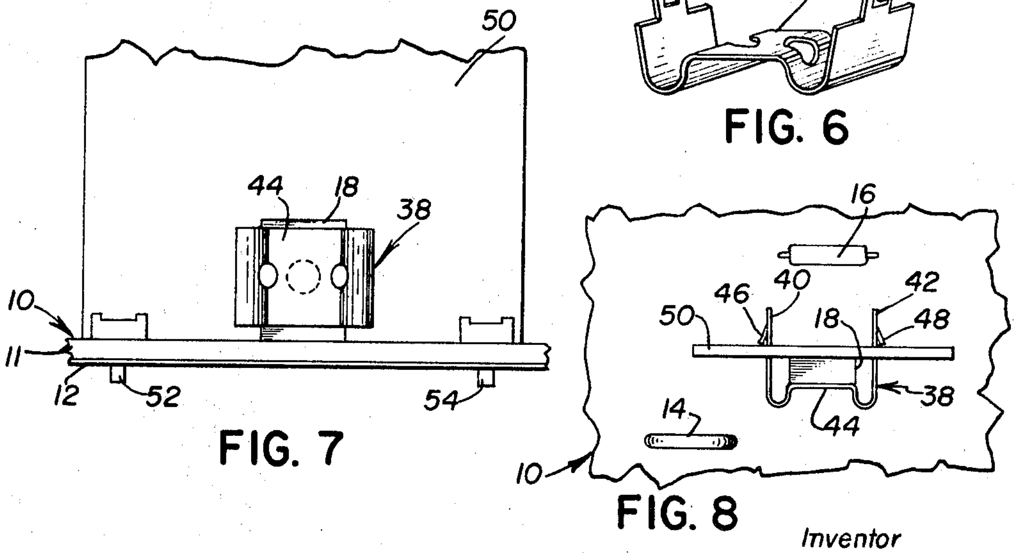
FIG. 7 is an elevation view of another form of the invention showing a printed circuit board, a metallic plate, and a transistor heat sunk to the plate.
FIG. 8 is a top view of a portion of the assembly of FIG. 7.

FIG. 7 illustrates another form of the invention which is useful where it is inconvenient to mount the transistor 18 adjacent an edge of the panel. In such case, a relatively thin plate 50 of material formed of aluminum, for example, is provided and mounted adjacent a transistor 18 located in the middle of the board. The plate has ears 52 and 54 which are inserted through appropriate openings in the panel 10 and then soldered. The transistor 18 may be attached either before or after the plate 50 is in place. The lower middle portion of the plate 50 may have the appearance shown in FIG. 5 in order to receive the clip 38 of FIG. 6.

What has been described, therefore, is a simple method for heat sinking a medium power transistor which takes a minimum amount of time to assemble yet provides secure mechanical connection and good heat transfer.

I claim:

1. In an electrical assembly including a printed circuit panel, a transistor and other electrical components mounted on said panel, means electrically interconnecting said transistor and said other components for conducting electric current therebetween thereby causing said transistor to generate heat, said transistor having a pair of opposing surfaces and a hole extending through at least one of said surfaces; the combination of: a body composed of thermally conductive material having a surface area substantially larger than the surface area of said transistor and having a surface in intimate contact with one of the surfaces of said transistor, clip means in intimate contact with the other of the surfaces of said transistor and having means engaging said body for drawing said transistor resiliently against said body, said clip means being composed of thermally conductive material for carrying the heat generated in said transistor to said body, one of said clip means and said body having a knub in mating engagement with said hole for minimizing movement of said transistor with respect to said body.

2. In an electrical assembly including a circuit panel, a semiconductor device and electrical components mounted on said panel, means electrically interconnecting said semiconductor device and said components for conducting current therebetween whereby said device generates heat, said semiconductor device having a pair of opposing surfaces and a hole extending through at least one of said surfaces; the combination of: a metallic plate having an area substantially larger than the surface area of said semiconductor device and having a surface in intimate contact with one of the surfaces of said semiconductor device, clip means in intimate contact with the other of the surfaces of said device and having means engaging said plate for drawing said semiconductor device resiliently against said plate, said clip means being composed of thermally conductive material for carrying the heat generated at said semiconductor device to said metallic plate, and said metallic plate having a knub in mating engagement with said hole of said semiconductor device.

References Cited

UNITED STATES PATENTS

| | | | |
|---|---|---|---|
| 3,259,813 | 7/1966 | Linstrand | 317—100 X |
| 3,316,454 | 4/1967 | Donath et al. | 317—100 |
| 3,348,101 | 10/1967 | Klein et al. | 317—100 |

LEWIS H. MYERS, Primary Examiner

G. P. TOLIN, Assistant Examiner

U.S. Cl. X.R.

317—234; 174—16